United States Patent
Kurita et al.

(10) Patent No.: US 6,717,064 B1
(45) Date of Patent: Apr. 6, 2004

(54) SUBSTRATE PIECE AND FLEXIBLE SUBSTRATE

(75) Inventors: Hideyuki Kurita, Tochigi (JP); Masato Taniguchi, Tochigi (JP); Masayuki Nakamura, Tochigi (JP); Hiroyuki Hishinuma, Tochigi (JP); Hidetsugu Namiki, Tochigi (JP)

(73) Assignee: Sony Chemicals Corp., Tokyo (JP)

( * ) Notice: Subject to any disclaimer, the term of this patent is extended or adjusted under 35 U.S.C. 154(b) by 0 days.

(21) Appl. No.: 09/494,040

(22) Filed: Jan. 31, 2000

(30) Foreign Application Priority Data

Feb. 5, 1999 (JP) .......................... 11-028035
Oct. 7, 1999 (JP) .......................... 11-287089

(51) Int. Cl.$^7$ ............................... H05K 1/02
(52) U.S. Cl. .................................. 174/259
(58) Field of Search .................... 174/254, 250, 174/255, 259; 361/749, 750, 751; 428/209, 901; 257/778, 700, 701, 702; 439/67, 77

(56) References Cited

U.S. PATENT DOCUMENTS

| | | | |
|---|---|---|---|
| 3,913,223 A | | 10/1975 | Gigoux |
| 5,306,546 A | | 4/1994 | Schreiber et al. |
| 5,457,881 A | | 10/1995 | Schmidt |
| 5,719,354 A | * | 2/1998 | Jester et al. ............. 174/255 |
| 5,737,837 A | * | 4/1998 | Inaba ...................... 439/67 |
| 5,874,784 A | * | 2/1999 | Aoki et al. .............. 257/666 |
| 6,015,607 A | * | 1/2000 | Fraivillig ................ 174/254 |
| 6,118,183 A | * | 9/2000 | Umehara et al. ......... 257/782 |
| 6,132,226 A | * | 10/2000 | Noda ...................... 439/91 |
| 6,163,957 A | * | 12/2000 | Jiang et al. .............. 174/36 |

FOREIGN PATENT DOCUMENTS

| | | |
|---|---|---|
| EP | 0 533 198 A2 | 3/1993 |
| EP | 0 533 198 A3 | 3/1993 |
| EP | 0 834 917 A1 | 4/1998 |
| GB | 1126370 | 9/1968 |
| JP | 58-182466 | 12/1983 |
| JP | 06-077293 | 3/1994 |
| JP | 10-256688 | 3/1997 |

* cited by examiner

Primary Examiner—Neil Abrams
Assistant Examiner—Phuong K T Dinh
(74) Attorney, Agent, or Firm—Oliff & Berridge, PLC

(57) ABSTRACT

A flexible printed wiring board constructed by using elemental pieces at a low cost.

The elemental pieces 81$a$ to 81$c$ according to the present invention are provided respectively with supporting films 24$a$ to 24$c$ on one face and adhesive resin films 19$a$ to 19$c$ on the other face. The supporting films 24$a$ to 24$c$ have connecting openings on the bottom face of which the surface of metal wiring circuits are exposed as lands 23$a$ to 23$c$. On the other hand, conductive bumps 16$a$ to 16$c$, which are connected respectively to the metal wiring circuits 14$a$ to 14$c$, project on the resin films 19$a$ to 19$c$. To construct a flexible printed wiring board 83 by using plural elemental pieces 81$a$ to 81$c$, the tips of the conductive bumps 16$b$ and 16$c$ are brought into contact respectively with the lands 23$a$ and 23$b$ on the bottom face of the openings and contact-bonded under heating. Thus, the elemental pieces 81$a$ to 81$c$ are adhered to each other owing to the adhesiveness of the resin film 19$b$ and 19$c$. The connection among the elemental pieces 81$a$ to 81$c$ can be further enhanced by surface-roughing the supporting films 24$a$ to 24$c$.

6 Claims, 11 Drawing Sheets

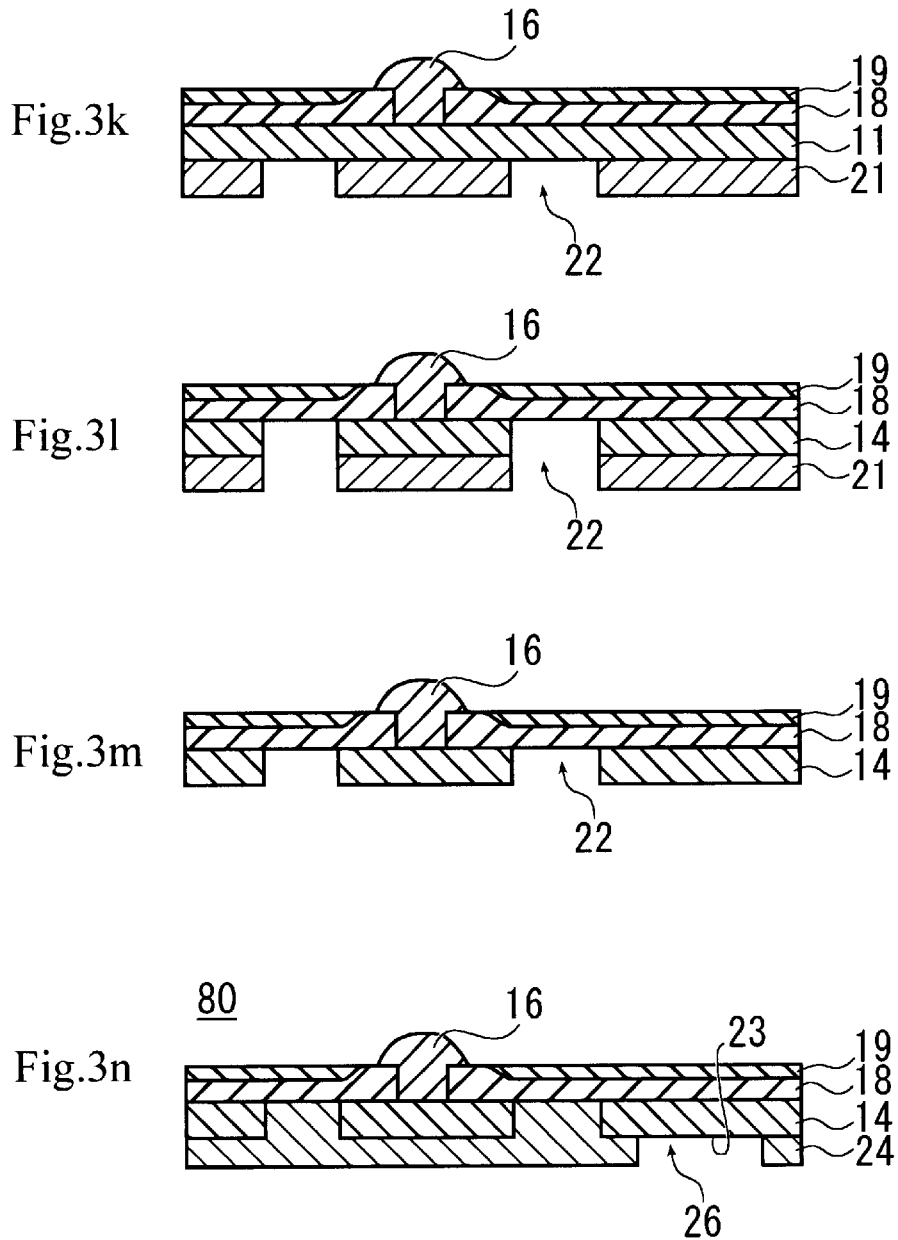

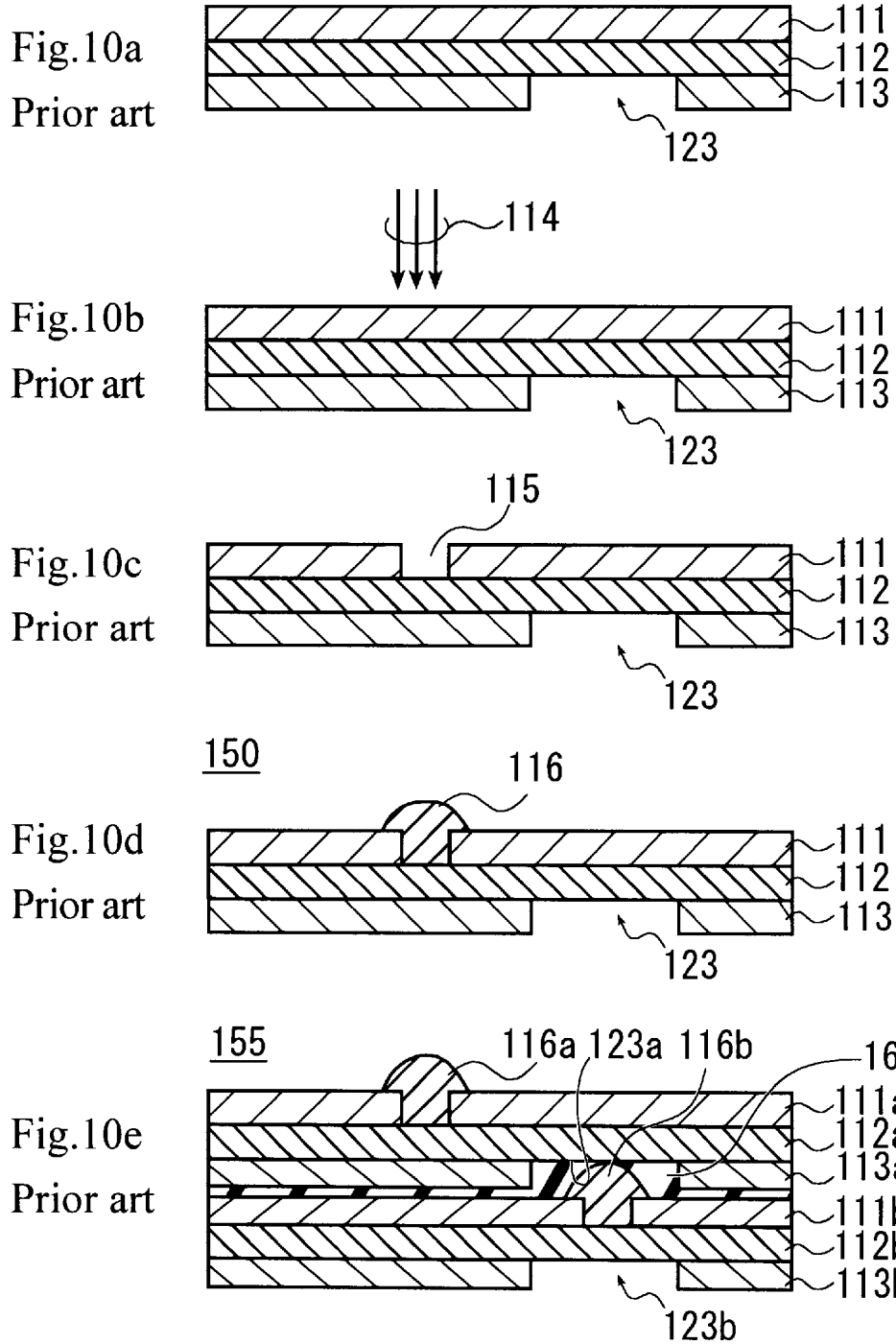

SUBSTRATE PIECE AND FLEXIBLE SUBSTRATE

FIELD OF THE INVENTION

This invention relates to the technical field of flexible printed wiring boards. More particularly, it relates to a technique for producing flexible printed wiring boards enabling the formation of fine conductive bumps.

BACKGROUND OF THE INVENTION

There have been frequently employed flexible printed wiring boards carrying desired circuit patterns printed thereon. In recent years, flexible printed wiring boards in various shapes are required corresponding to the shapes of the parts where these flexible printed wiring boards are to be used.

FIG. 11a shows an arrangement plan for cutting out T flexible printed wiring boards 152 from a rectangular master sheet 150. In this case, six flexible printed wiring boards 152 can be obtained.

In cutting out specially shaped flexible printed wiring boards as 152 in the above case, however, it is frequently observed that the master sheet 150 is much wasted.

In the conventional art, therefore, attempts have been made to take a flexible printed wiring board in a complicated shape apart into elemental pieces in simple shapes and then bond these pieces together to give a flexible printed wiring board. In FIG. 11c, a flexible printed wiring board 155 having the same shape as the flexible printed wiring board 152 is formed by bonding two rectangular elemental pieces 153 and 154 to each other.

As FIG. 11b shows, the master sheet 150 can be efficiently utilized by cutting out the elemental pieces 153 and 154 in simple shapes therefrom. In the case of FIG. 11b, eight elemental pieces 153 and 154 can be respectively obtained. By bonding these pieces to each other, therefore, eight flexible printed wiring boards 155 can be formed. Namely, the flexible printed wiring boards can be thus obtained in a larger number than the case when the T flexible printed wiring boards 152 are directly cut out.

To bond plural elemental pieces to each other to thereby form a flexible printed wiring board, it is necessary to mechanically and electrically connect these elemental pieces to each other.

The elemental pieces 153 and 154 as described above are connected to each other via conductive bumps preliminarily formed on the master sheet 150. Now, a method for producing the master sheet 150 by the conventional art will be described.

In FIG. 10a, 113 stands for a supporting film made of polyimide and a metal wiring circuit 112 made of a patterned copper foil is adhered onto the surface of the supporting film 113. Further, a cover lay 111 made of a polyimide film is adhered onto the copper foil 112.

First, the cover lay film 111 is irradiated at the definite position with laser beams 114 (FIG. 10b) to form plural openings 115 (FIG. 10c) (FIG. 10c shows only one opening 115.). The supporting film 113 is provided with connecting openings 123 in which the bottom face of the metal wiring circuit 112 is exposed (only one connecting opening 123 is shown in each FIG. 10a~d). In each opening 115 formed above, the surface of the metal wiring circuit 112 is exposed.

Subsequently, a protective film is formed on the back face of the supporting film 113 to protect the connecting openings 123. After copper-plating, the protective film is stripped off. Thus, copper grows within each opening 115 by the copper-plating and thus conductive bumps 116 are formed (FIG. 10d).

From the master sheet 150 in the above-described state, elemental pieces 153 and 154 are cut out. In FIG. 10e, 153 and 154 stand for the elemental pieces thus cut out wherein members of these two elemental pieces 153 and 154 are each distinguished from the corresponding one by a or b.

The conductive bump 116b of the elemental piece 154 (i.e., one of the two elemental pieces 153 and 154) is located toward the connecting opening 123a of the other elemental piece 153. The tip of the conductive bump 116b is brought into contact with the metal wiring circuit 112a exposed in the connecting opening 123a via an anisotropic conductive film 160. Thus, these two elemental pieces 153 and 154 are adhered to each other due to the anisotropic conductive film 160 thereby giving a specially shaped flexible printed wiring board 155.

The metal wiring circuits 112a and 112b serving as two layers of this flexible printed wiring board 155 are electrically connected to each other via conductive particles dispersed in the anisotropic conductive film 160, while the two elemental pieces 153 and 154 are adhered to each other owing to the adhesiveness of the anisotropic conductive film 160.

When a semiconductor chip such as an integrated circuit device is to be packaged in the above-described flexible printed wiring board 155, the anisotropic conductive film is located on the conductive bump 116a and then a bonding pad of the semiconductor device is brought into contact with the conductive bump 116 via the anisotropic conductive film followed by bonding. The inner circuit of the semiconductor device is connected to the metal wiring circuits 112a and 112b via the conductive particles in the anisotropic conductive film and the conductive bumps 116a and 116b.

By adhering such elemental pieces as the above-described ones 153 and 154, it is possible to obtain flexible printed wiring boards in a desired shape which are thin, light and freely bendable as the one 155. Therefore, this technique has been frequently employed in recent years.

When the openings 115 are formed by using laser beams 114 as in the above case, however, the residue of the polyimide film 111 remains in the surface of the metal wiring circuit 112 exposed on the bottom of the openings 115. In the conventional art, therefore, the elemental piece is soaked in a chemical solution, after the formation of the openings 115, so as to eliminate the residue therefrom. As the openings 115 become finer, however, the chemical solution can hardly enter the openings 115 and thus the residue can be hardly eliminated.

When the residue cannot be eliminated, the copper deposition speed varies from opening to opening and, in its turn, uniform conductive bumps 116 cannot be formed.

Since the opening 115 is formed by irradiating a rigid polyimide film (i.e., the cover lay 111) with laser beams 114, the opening size varies, when the opening is fine (diameter about 40 to 50 μm). As a result, the diameter and height of the thus formed conductive bump varies, which causes a contact failure with the semiconductor. Although attempts have been made recently to form finer opening 115, it is difficult to stop down the high output laser beams 114. It is therefore impossible to form the opening 115 having diameter less than 40 μm.

Moreover, there arises another problem that the adhesion of the elemental pieces 153 and 154 to each other with the anisotropic conductive film 160 makes the flexible printed wiring board 155 expensive.

SUMMARY OF THE INVENTION

The present invention, which has been made to overcome the above-described troubles encountering in the prior art, aims at providing a flexible printed wiring board at a low cost by using finely patterned elemental pieces.

To achieve those objects, the present invention relates to an elemental piece of a flexible printed wiring board having a metal wiring circuit patterned into a definite shape, a supporting film located in the side of one face of said metal wiring circuit, and a resin film located in the side of the other face of said metal wiring circuit, wherein said supporting film is provided with at least one connecting opening in which the surface of said metal wiring circuit is exposed and at least one conductive bump connected to said metal wiring circuit projects on said resin coating.

The present invention relates to said elemental piece, wherein said resin film surface has an adhesiveness.

The present invention relates to said elemental piece, wherein said supporting film is made of polyimide.

The present invention relates to said elemental piece, wherein a surface-roughed layer is formed on the surface of said supporting film.

The present invention relates to a flexible printed wiring board having at least two said elemental pieces, wherein the tip of said conductive bump of one elemental piece is in contact with the metal wiring circuit surface exposed in said connecting opening of the other elemental piece, and said elemental pieces are adhered to each other due to the adhesiveness of said resin film of the former elemental piece.

The present invention relates to a flexible printed wiring board having said flexible printed wiring board, and a semiconductor device provided with at least one conductive bump connected to an internal circuit, wherein the conductive bump of said semiconductor device is connected to said metal wiring circuit surface exposed in said connecting opening of said flexible printed wiring board via an anisotropic conductive film.

BRIEF DESCRIPTION OF THE DRAWINGS

FIGS. 3k to n are diagrams showing the further subsequent steps thereof.

FIG. 9a is a diagram illustrating an elemental piece which is another example of the embodiment of the present invention, while

FIG. 10a to e are diagrams showing the production process of a flexible printed wiring board by the conventional technique.

Figure 1A:
FIGS. 1a to e are diagrams showing the first half of a process for producing elemental pieces of a flexible substrate according to the present invention.

In these figures, each numerical symbol has the following meaning:

11: metal foil
14: metal wiring circuit
16: conductive bump
18: resin film (non-adhesive one)
19: resin film (adhesive and thermoplastic one)
24: supporting film
26: connecting opening
28: surface-roughed layer
50: semiconductor device
56: conductive bump of semiconductor device
60: anisotropic conductive film
80: master sheet
81(81a, 81b): elemental pieces
83, 84: flexible printed wiring board

DETAILED DESCRIPTION OF THE INVENTION

In the present invention having the constitution as described above, the elemental piece of the flexible printed wiring board is provided with a supporting film on one face and a resin coating on the other face.

The supporting film has at least one connecting opening and the surface of a metal wiring circuit is exposed as a land on the bottom face of the opening. The tip of conductive bump projects on the surface of the resin coating.

When the resin film surface has an adhesiveness (for example, an adhesive and thermoplastic resin film being laminated on a non-thermoplastic resin film), the tip of the conductive bump is brought into contact with the metal wiring circuit in the connecting opening of the other elemental piece and then contact-bonded under heating, the metal wiring circuits (copper wires) of the elemental pieces are adhered to each other due to the adhesiveness of the resin film. Thus, a flexible printed wiring board composed of plural elemental pieces can be obtained.

When the resin film has no adhesiveness, the elemental pieces can be adhered to each other by inserting an adhesive resin film between them.

The adhesive or non-adhesive resin film may be made of polyimide. Also, the supporting film may be made of polyimide. Use of polyimide makes it possible to obtain elemental pieces having a high heat stability.

When the surface part of the supporting film is formed into a surface roughed layer by roughing, the affinity of the supporting film with the adhesive resin film or resin film can be elevated and thus plural elemental pieces can be strongly connected to each other. The effect by roughing can be further enhanced by using polyimide as the supporting film to be roughed. When the resin film is a non-adhesive one, it may be surface-roughed together with the supporting film.

The above-described flexible printed wiring board has at least one conductive bump projecting on at least one face and at least one connecting opening formed on the other face. The adhesive resin film is formed in the conductive bump side. When a semiconductor device is to be connected to the flexible printed wiring board, therefore, the lands of the semiconductor device are brought into contact with the conductive bumps of the flexible printed wiring board and the semiconductor device is adhered to the flexible printed wiring board owing to the adhesiveness of the resin film. To further ensure the connection, large-size conductive bumps are formed on the semiconductor device and brought into contact, via an anisotropic conductive film, with the metal wiring circuit surface exposed in each opening. Thus, the semiconductor device is loaded on the flexible printed wiring board owing to the adhesiveness of the anisotropic conductive film.

Now, the present invention will be described by reference to the attached drawings.

Figure 4O:
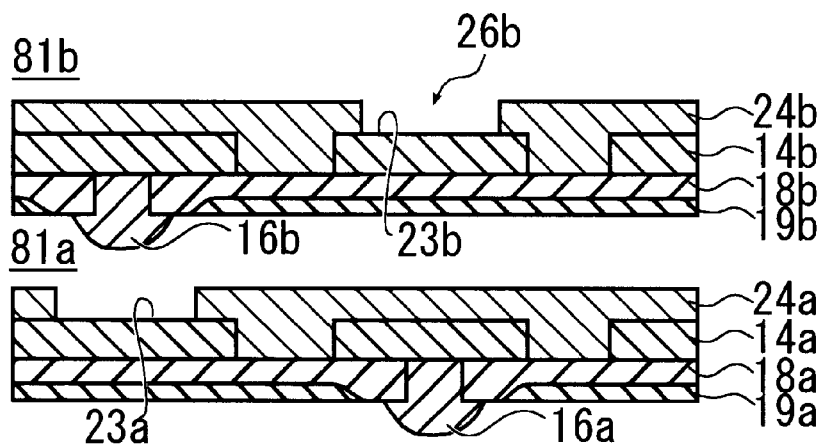
FIGS. 4o and p are diagrams showing the process for adhering the elemental pieces to each other.
Figure 5Q:
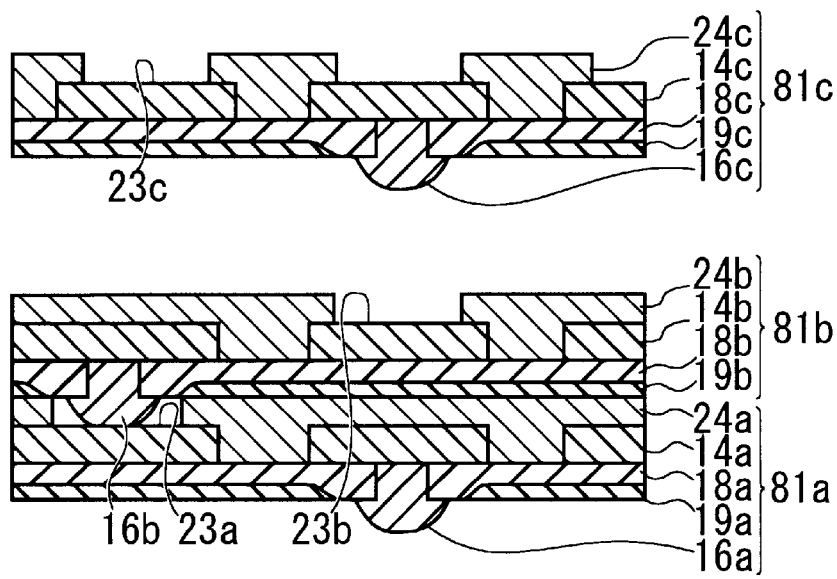
FIGS. 5q and r are diagrams showing the process for further adhering the elemental pieces.
Figure 6:
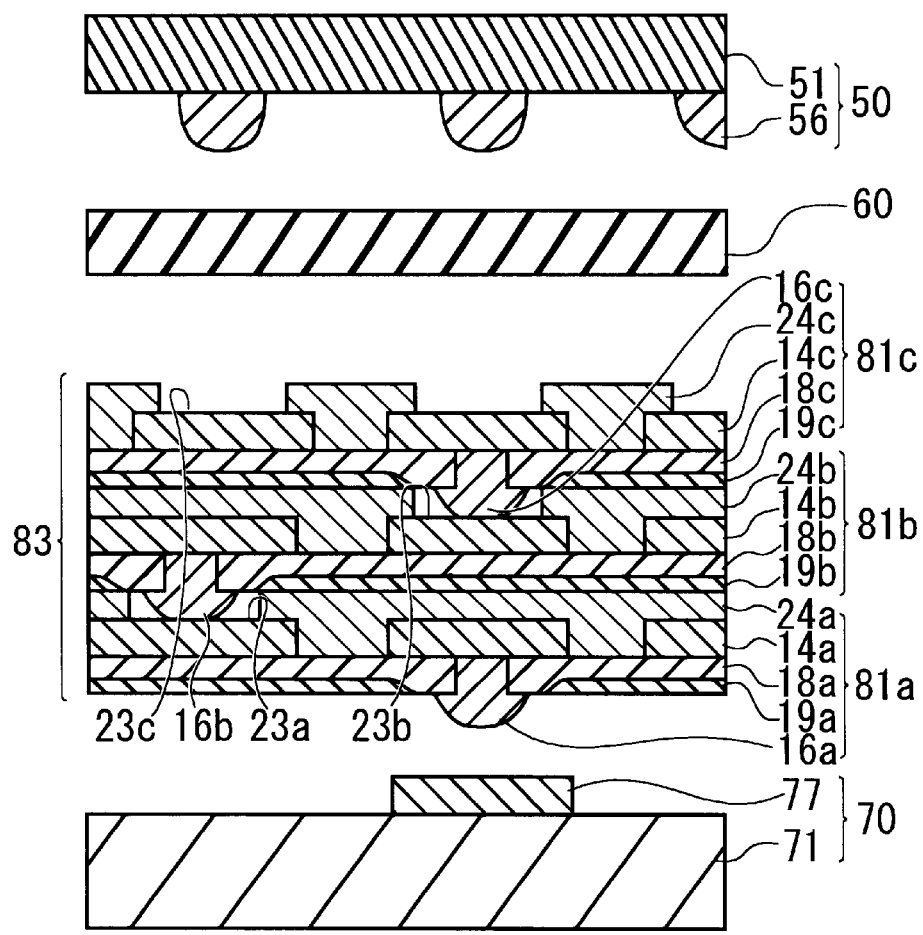
FIG. 6 is a diagram showing a semiconductor device connecting to a flexible printed wiring board.
Figure 7:
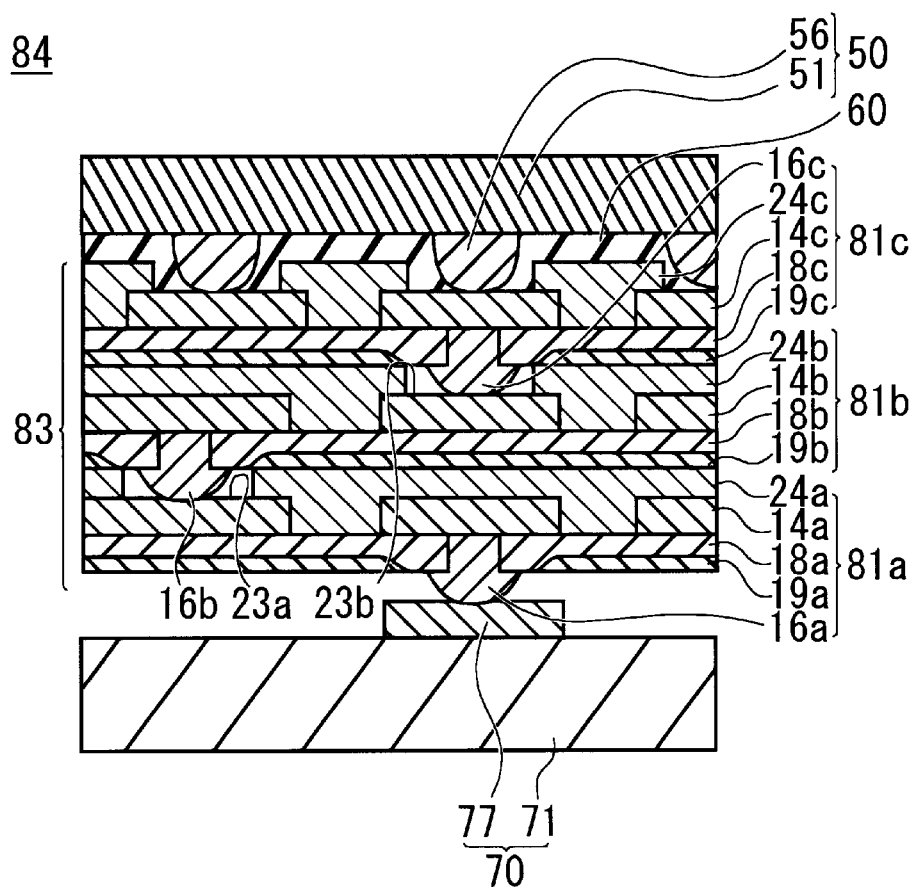
FIG. 7 is a diagram showing a flexible printed wiring board according to the present invention.

FIGS. 1a to e, FIGS. 2f to j, FIGS. 3k to n, FIGS. 4o and p, FIGS. 5q and r, FIG. 6 and FIG. 7 show an example of the production process of the flexible printed wiring board according to the present invention.

Figure 1B:
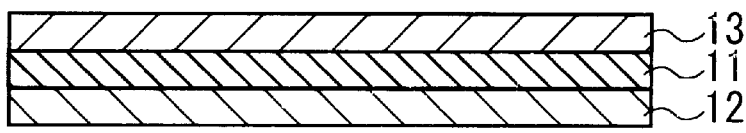
Figure 1C:
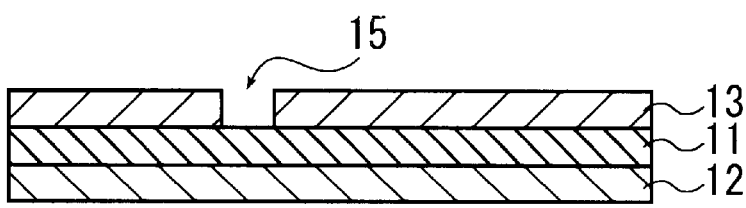

As FIG. 1a shows, a metal foil (a rolled copper foil of 18 μm in thickness in this case) is prepared. Next, a protective film 12 is adhered onto the back face of the metal foil 11, while an UV-exposable mask film (SPG-152, dry film manufactured by Asahi Chemical Industry) 13 is adhered to the front face, as shown in FIG. 1b. (The mask film 13 is adhered at 130° C. at a line speed of 2 m/min.)

Next, the mask film 13 is exposed to light (exposure light intensity: 100 mJ) by using a definitely patterned glass mask and then developed with a chemical solution. Thus, plural openings 15 are formed at positions corresponding to conductive bumps 16 as will be described hereinafter (FIG. 1c; in this Figure, only one opening 15 is shown).

In this step, the diameter of each opening 15 can be controlled at an accuracy of ±2.5 μm, based on the mask pattern diameter of 30 to 50 μm, while its height can be controlled at an accuracy of ±2 μm.

Figure 1D:
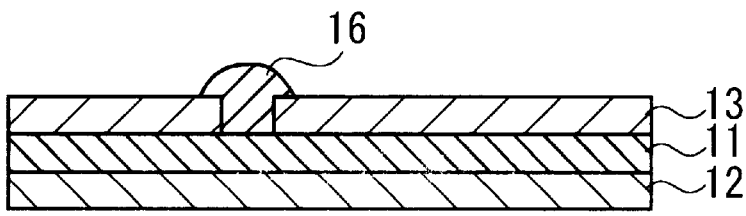

Next, the whole elemental piece is soaked in an electrolyte for copper-plating and electricity is passed. Thus, copper grows on the surface of the metal foil 11 exposed on the bottom of each opening 15 and thus conductive bumps 16 are formed (FIG. 1d).

After the development of the mask film 13, the surface of the metal foil 11 is exposed in a residue-free and clean state on the bottom of each opening 15. Thus, each conductive bump 16 can be formed at a uniform height.

Figure 1E:
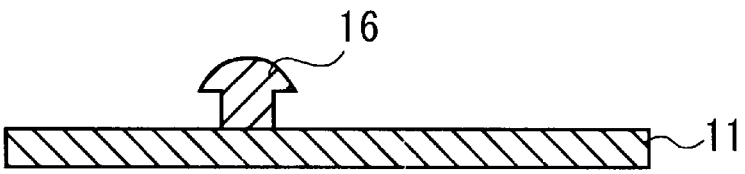
Figure 2F:
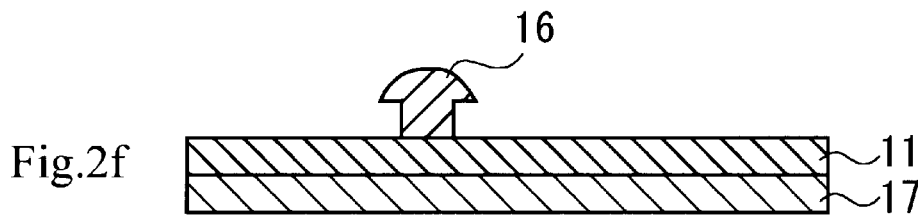
FIGS. 2f to j are diagrams showing the subsequent steps thereof.
Figure 2G:
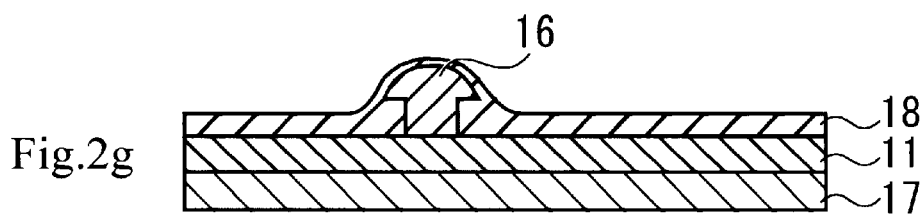

Next, the mask film 13 and the protective film 12 are eliminated by using an alkali (FIG. 1e). In this state, the mushroom like conductive bumps 16 are formed upright on the surface of the metal foil 11. A carrier film 17 is adhered onto the back face of the metal foil 11 (FIG. 2f). Subsequently, a resin material made of a polyimide precursor is applied onto the front face of the metal foil 11 and dried to thereby form a resin film 18 made of the polyimide precursor (FIG. 2g).

This resin film 18 rises on the conductive bumps 16 and around it but remains flat apart therefrom. The thickness of the flat part is regulated not exceeding the height of each conductive bump 16 so the tips of the conductive bumps 16 can project on the flat part.

The resin film 18 may be either an adhesive or a nonadhesive one. When it is not an adhesive one but termosetting one, another adhesive resin film may be further laminated on the surface of the resin film 18.

Figure 2H:
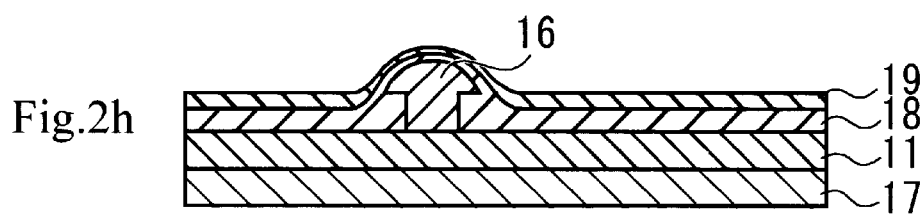

In FIG. 2h, 19 stands for a resin film of the resin material which has been applied onto the resin film 18 and dried. Thus two resin films 18 and 19 are laminated together. In this case, the resin film 19 serving as the upper layer is an adhesive and thermoplastic one, differing from the resin film 18 serving as the lower layer.

When the resin film 18 serving as the lower layer has an adhesiveness but only an insufficient thickness can be achieved by applying and drying once, it is also possible to apply again the resin material comprising the polyimide precursor followed by drying.

Figure 2I:
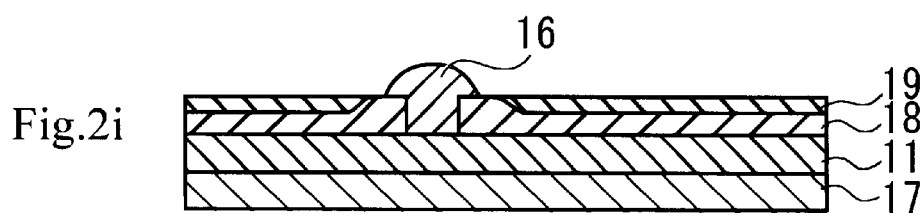

Next, an alkali solution is sprayed downward to the resin films 18 and 19 and the surface is etched to thereby expose the tips of the conductive bumps 16 (FIG. 2i).

With respect to the etching conditions, the surface can be etched in a depth of 2 to 5 μm by spraying the alkali solution at 25° C. for 20 seconds. The etching may be carried out by using a plasma cleaner as a substitute for the alkali solution.

Figure 2J:
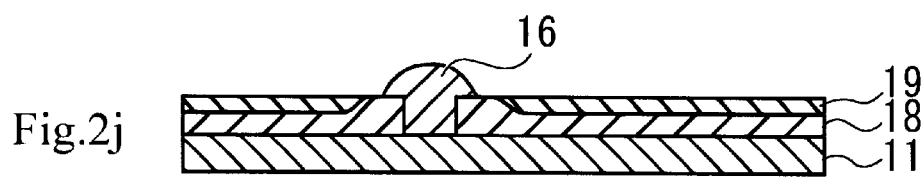

Subsequently, the carrier film 17 adhered to the back face is stripped off. By heating (280° C., 10 minutes), the resin films 18 and 19 turns into a film. Thus, a resin film composed of two polyimide layers is formed on the surface of the metal foil 11 (FIG. 2j).

Next, a photosensitive resin film is adhered to the back face of the metal foil 11. Then the photosensitive resin film is patterned in a definite shape by exposing to light and developing to thereby give a mask film 21 (FIG. 3k). This mask film 21 is provided with openings 22 as shown in FIG. 3k.

Then the copper foil 11 exposed on the bottom faces of the openings 22 are eliminated by etching and thus the pattern of the mask film 21 is transcribed onto the metal foil 11. The metal foil 11 is cut in the same pattern as the openings 22 and thus a desired metal wiring circuit 14 can be obtained (FIG. 3l).

Figure 8:
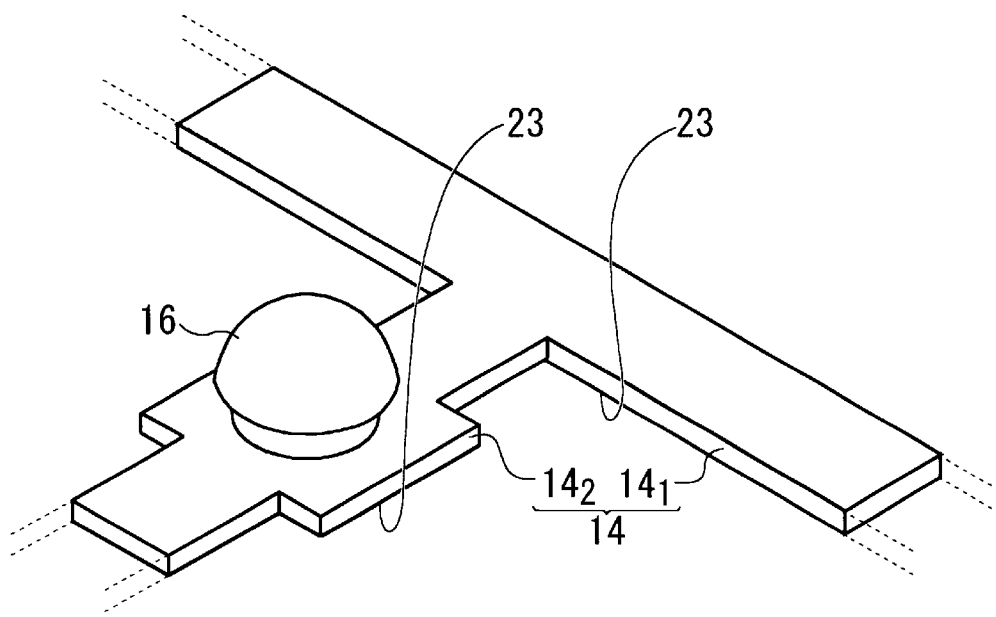
FIG. 8 is a diagram showing a metal wiring circuit and a conductive bump on the elemental piece.

As FIG. 8 shows, this metal wiring circuit 14 is roughly divided into a long and narrow wiring part 14$_1$, a connecting part and a conductive bump 16—growth part 14$_2$ as will be described hereinafter.

Subsequently, the mask film 21 is taken off and the back face of the metal wiring circuit 14 is exposed (FIG. 3m). Then a polyimide precursor is applied onto this part and dried to thereby form a film made of the polyimide precursor. After applying a photosensitive resist on the surface, the polyimide precursor film on the back face of the metal wiring circuit 14 is patterned and then the photoresist is stripped off. The polyimide precursor film is hardened by heating and thus a supporting film 24 made of polyimide is formed on the back face of the metal wiring circuit 14 (FIG. 3n).

In FIG. 3n, 80 stands for a master sheet wherein the supporting film 24 is formed. The supporting film 24 formed in this master film has connecting openings 26 on the bottom face of which the metal wiring circuit 14 is exposed (FIG. 3n shows only one connecting opening 26.). Namely, the surface parts of the metal wiring circuit 11 serve as the lands 23.

Next, elemental pieces in a simple shape are cut out from the master sheet 80. In FIG. 4o, 81a and 81b stand for two elemental pieces wherein each member has the same numerical symbol as in FIG. 3n. The members of these two elemental pieces 81a and 81b and those of another elemental piece 81c, as will be described hereinafter, are distinguished from each other by a, b and c.

The conductive bump 16b of one elemental piece 81b is located toward the opening 26a of the other elemental piece 81a and closely pressed thereto. Thus, the tip of the conductive bump 16b is brought into contact with the land 23a in the opening 26a. In this step, the adhesive and thermoplastic resin film 19b on the surface of the elemental piece 81b is brought into contact with the surface of the supporting film 24a of the other elemental piece 81a.

Figure 4P:
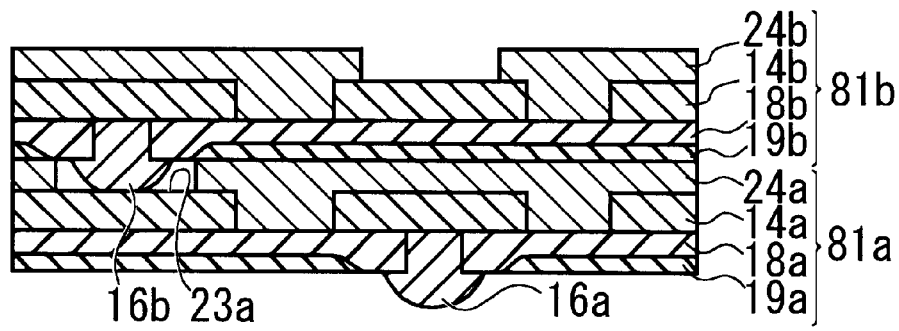

Since the resin films 19 (19a and 19b) are adhesive and thermoplastic ones, the two elemental pieces 81a and 81b can be adhered to each other by contact-bonding them under heating. In this state, the thermoplastic resin film 19b and the resin film 18b located below it are compressed. Thus the conductive bump 16b is strongly pressed against the land 23a continuously so that the metal wiring circuits 14a and 14b of the two elemental pieces 81a and 81b are electrically connected with each other(FIG. 4p).

In FIG. 5q, 81c stands for the third elemental piece. A conductive bump 16c formed on the surface of the elemental piece 81c is located toward the opening 26b on the back face of the elemental piece 81b, which has been adhered as described above, and contact-bonded to it under heating. Thus, the tip of the conductive bump 16c is brought into contact with the land 23b. The third elemental piece 81c is adhered to the elemental piece 81b via the adhesive and thermoplastic resin film 19c.

Figure 5R:
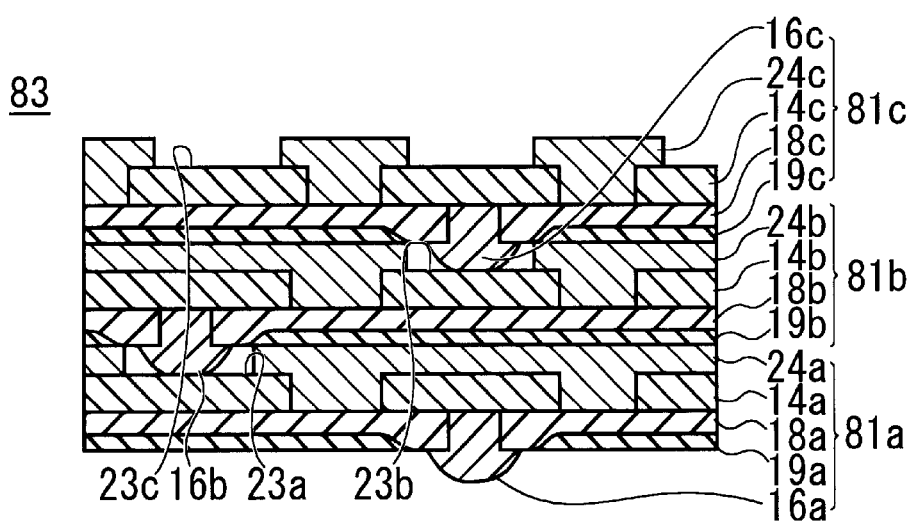

In FIG. 5r, 83 stands for a flexible printed wiring board wherein the three elemental pieces 81a, 81b and 81c have been adhered in the above-described manner.

In this flexible printed wiring board 83, the metal wiring circuit 14 is protected on the both faces (i.e., the front and back faces) by the resin films 18 and 19 and the supporting film 24. As FIG. 5r shows, the tip of the conductive bump 16a of the elemental piece 81a (the one located lowermost) projects, while the land of the elemental piece 81c serving as the uppermost layer is exposed on the surface.

Now, how to utilize this flexible printed wiring board 83 will be illustrated.

In FIG. 6, 50 stands for a semiconductor device such as an integrated circuit device, 60 stands for an anisotropic conductive film and 70 stands for a print substrate.

The semiconductor device 50 is provided with conductive bumps 56 (FIG. 6 shows only one conductive bump 56.) on the surface of the semiconductor substrate 51. The anisotropic conductive film 60 is located above the land 23c exposed on the surface of the flexible printed wiring board 83. The conductive bump 56 of the semiconductor device 50 is brought into contact with the land 23c via the anisotropic conductive film 60 and contact-bonded under heating. Thus, the semiconductor device 50 is adhered to the flexible printed wiring board 83.

The conductive bump 16a projecting on the back face of the flexible printed wiring board 83 can be connected with the print substrate 70 by, for example, bringing into contact with the land 77 provided on the body 71 of the print substrate 70 and melting the land 77.

In FIG. 7, 84 stands for the flexible printed wiring board on which the semiconductor 50 has been loaded and packaged on the print substrate 70. In FIG. 7, the adhesive resin film 19a exposed on the back face of the flexible printed wiring board 83 is separated from the body 71 of the print substrate 70. In a part where the body 71 is in contact with the resin film 19a owing to the flexibility of the flexible printed wiring board 83, however, the flexible printed wiring board 83 and the body are fixed to each other due to the adhesiveness of the resin film 19a.

In the above example, the supporting film 24 having the connecting openings 26 and the resin films 18 and 19 are formed after the formation of the conductive bumps 16. It is therefore unnecessary to form any openings on the resin film with the use of laser beams. Therefore, fine conductive bumps 16 can be formed at high accuracies.

In the above case, the conductive bumps 16 are formed through the growth of copper by plating. However, it is also possible to use other metals. Similarly, the metal foil 11 is not restricted to copper. The resin films 18 and 19 may have either a one- or two-layered structure, though it is preferable that the adhesive resin film 19 is exposed on the surface. The materials of the resin films 18 and 19 are not restricted to polyimide.

It is favorable that a gold coating (thickness: about 1 to 2 $\mu$m) is formed on the surface of the conductive bump 16 made of copper by plating, etc.

In the above case, the conductive bumps 16 are formed through the growth of copper by plating. However, the conductive bumps 16 formed in the master sheet 80 may be ones which are obtained by connecting metal particles (solder balls, etc.) to the metal wiring circuit exposed on the bottom face of the openings 15. When large-sized metal particles are provided, they are usable also in connecting to the print substrate 70. In this case, the metal particles may be preliminarily connected to the master sheet 80. Alternatively, the metal particles may be connected to the flexible printed wiring board after cutting out the elemental pieces and constructing the flexible printed wiring board therefrom.

In the above example, either conductive bumps or connecting openings are formed on one face of the flexible printed wiring board. However, it is also possible to construct a flexible printed wiring board having conductive bumps on the whole both faces or a part of each face by using elemental pieces having conductive bumps on both faces.

On the contrary, it is also possible to construct a flexible printed wiring board having openings on the whole both faces or a part of each face.

Although the patterned polyimide precursor film is hardened and the thus formed supporting film 24 is adhered to the resin film 19 as such in the above example, the present invention is not restricted thereto.

Figure 9A:
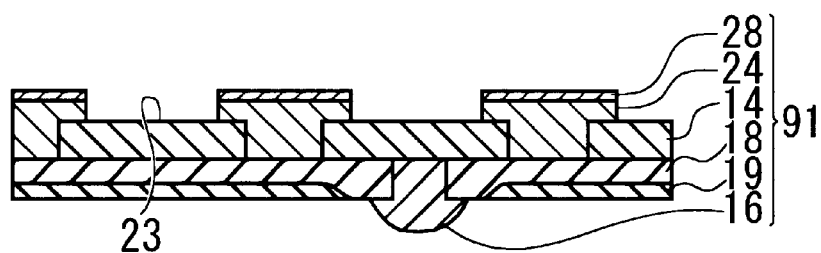

In FIG. 9a, 91 stands for an elemental piece having the same structure as the elemental piece 81 described above. Onto the surface of the supporting film 24 of this elemental piece 91, an inorganic powder (silica gel, alumina, etc.) is jetted at a high speed (the sandblast method) to be roughed. In FIG. 9a, 28 stands for a surface-roughed layer formed in the surface part of the supporting film 24. To substitute for the sandblast method, it is also possible to form surface roughed layer by rubbing the surf ape of the supporting film 24 with cloth or the like. Compared with the non-roughed surface of the supporting film 24, this surface-roughed layer 28 has a high affinity with adherends.

Figure 9B:
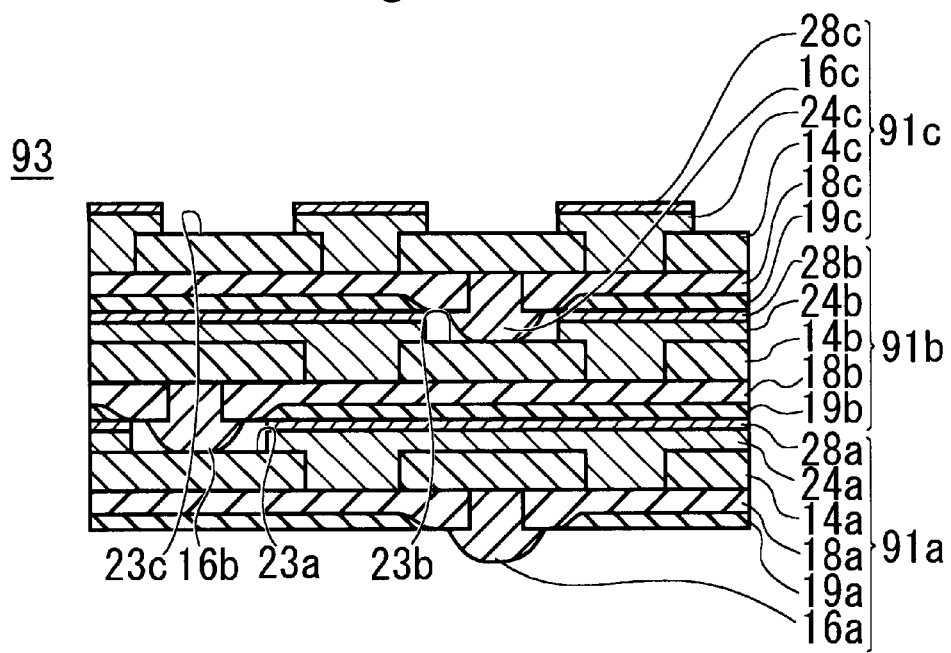
FIG. 9b is a diagram illustrating a flexible printed wiring board constructed by adhering elemental pieces which are another example of the embodiment of the present invention.
Figure 11A:
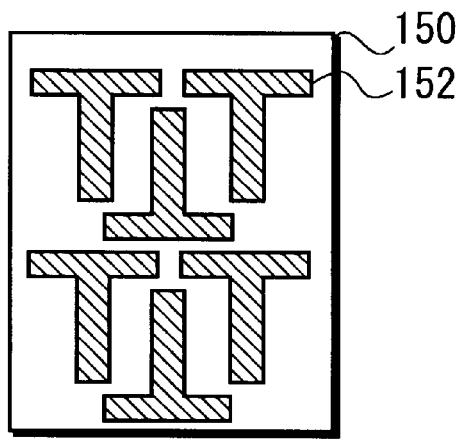
FIGS. 11a to c are diagrams showing the production process of a specially shaped flexible printed wiring board by the conventional technique.
Figure 11B:
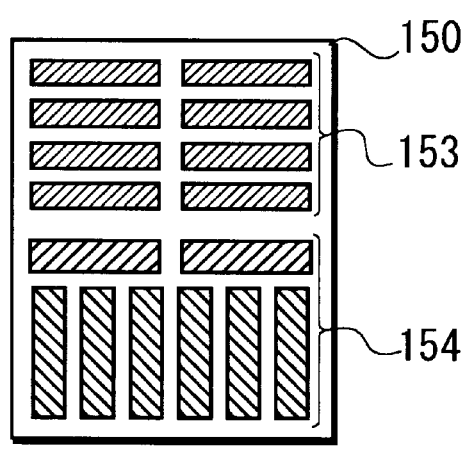
Figure 11C:
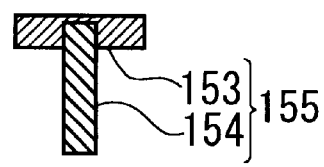

In FIG. 9b, a flexible printed wiring board 93 is constructed by adhering plural elemental pieces each having a surface-roughed layer (91a, 91b and 91c) to each other in the same manner as that of the flexible printed wiring board 83 shown in FIG. 5r. Thus, the surface-roughed layers 28a and 28b, which are respectively located between the elemental pieces 91a and 91b and between the elemental pieces 91b and 91c, are closely bonded respectively to the thermoplastic resin films 19b and 19c showing adhesiveness under heating and strongly adhered thereto.

In this flexible printed wiring board 93, the elemental pieces 91a, 91b and 91c are strongly connected with each other via the surface-roughed layers 28a and 28b. Thus, the flexible printed wiring board 93 is superior in reliability than the flexible printed wiring board 83 having no surface-roughed layer.

Flexible printed wiring boards of the same structures of the flexible printed wiring boards 83 and 93 were constructed and subjected to a high-temperature storage test (260° C., 1 hour). The adhesion strength was measured before and after the test. The following table summarizes the results.

TABLE 1

| | High-temperature storage test | | | | | |
|---|---|---|---|---|---|---|
| Example No. | 1 | 2 | 3 | 4 | 5 | 6 |
| Adhesive material | PI | PI | PI | EP | PI | PI |
| Roughed layer | Yes | Yes | Yes | Yes | No | No |
| surface roughness (μm) | 1.0 | 3.0 | 5.0 | 5.0 | 0.1 | 0.1 |
| Initial adhesion strength (kg/cm) | 0.6 | 0.8 | 0.8 | 0.9 | >0.1 | 0.8 |
| Adhesion strength after test (kg/cm) | 0.4 | 0.5 | 0.5 | 0.2 | >0.1 | 0.2 |

PI:thermoplastic polyimide.
EP:an epoxy-based adhesive

In Examples 1 to 4, flexible printed wiring boards were formed by adhering elemental pieces each having a surface-roughed layer on the surface of the supporting film. In Examples 1 to 3, thermoplastic polyimide was employed as the adhesive resin film material while an epoxy-based adhesive was employed in Example 4. The samples of Examples 1 to 3 and 4 differed in surface roughness from each other, as Table 1 shows the data.

In Examples 5 and 6, on the other hand, flexible printed wiring boards were constructed by adhering elemental pieces having no surface-roughed layer to each other. Thermoplastic polyimide was employed as the resin film material in Example 5, while the epoxy-based adhesive was employed in Example 6.

A comparison of Examples 1 to 4 with Examples 5 and 6 indicates that the adhesion strength was elevated by providing the surface-roughed layers. The samples of Examples 1 to 3 showed high adhesion strengths after the high-temperature storage test, which indicates that the formation of the surface-roughed layers is particularly effective in a case which the adhesive resin film is made of thermoplastic polyimide.

In Example 4, in contrast, the adhesion strength after the high-temperature storage test was almost comparable to that of Example 5 having no surface-roughed layer.

The sample of Example 4 had the surface-roughed layers but its adhesive resin films was made of the epoxy-based adhesive. It is assumed that the effect of surface-roughing was lost since the temperature employed in the high-temperature storage test exceeded the glass transition temperature of the epoxy-based adhesive.

Although the sandblast method was employed for surface-roughing in the above Examples, the present invention is not restricted thereto. Examples of other surface-roughing methods include a laser method, a method of etching the surface of the supporting film with an alkali solution, a method of pressing a roughed surface template against the surface of the supporting film, a method of forming the supporting film on an electrolytic copper foil with a rough surface, etc. That is, any methods may be used therefor, so long as a surface-roughed layer can be formed thereby on the surface of the supporting film to be adhered to the thermoplastic coating.

According to the present invention, a flexible printed wiring board of a complicated shape can be constructed by using elemental pieces in simple shapes, which prevents waste of the master sheet. By surface-roughing the elemental pieces, the elemental pieces constituting the flexible printed wiring board can be more strongly connected with each other.

A flexible printed wiring board in a desired shape can be produced by using a master sheet produced by the same process.

What is claimed is:

1. An elemental piece of a flexible printed wiring board, comprising:
   a metal wiring circuit patterned into a definite shape;
   a supporting film located on the side of a first face of said metal wiring circuit; and
   an adhesive resin film located on the side of a second face of said metal wiring circuit;
   wherein said supporting film is provided with at least one connecting opening in which said first face of said metal wiring circuit is exposed and at least one conductive bump connected to said second face of said metal wiring circuit projects from said adhesive resin film, said adhesive resin film being on said second face of said metal wiring circuit to adhere with another elemental piece.

2. The elemental piece as claimed in claim 1, wherein said supporting film is made of polyimide.

3. The elemental piece as claimed in claim 1, wherein a surface-roughed layer is formed on the face of said supporting film.

4. The elemental piece as claimed in claim 2, wherein a surface-roughed layer is formed on the face of said supporting film.

5. A flexible printed wiring board having at least two elemental pieces as claimed in claim 1;
   wherein the tip of said conductive bump of one elemental piece is in contact with said metal wiring circuit face exposed in said connecting opening of the other elemental piece; and
   said elemental pieces are adhered to each other due to the adhesiveness of said resin film of the former elemental piece.

6. A flexible printed wiring board having:
   the flexible printed wiring board as claimed in claim 5; and
   a semiconductor device provided with at least two conductive bumps connected to an internal circuit;
   wherein said conductive bumps of said semiconductor device are connected to said metal wiring circuit surface exposed in said connecting opening of said flexible printed wiring board as claimed in claim 5; via an anisotropic conductive film.

* * * * *